(12) United States Patent
Zhang et al.

(10) Patent No.: US 6,965,499 B1
(45) Date of Patent: Nov. 15, 2005

(54) HEAD SUSPENSION CONFIGURED FOR IMPROVED THERMAL PERFORMANCE DURING SOLDER BALL BONDING TO HEAD SLIDER

(75) Inventors: Yiduo Zhang, Plymouth, MN (US); Raymond R. Wolter, Hutchinson, MN (US); Craig A. Leabch, Saint Cloud, MN (US)

(73) Assignee: Hutchinson Technology Incorporated, Hutchinson, MN (US)

( * ) Notice: Subject to any disclaimer, the term of this patent is extended or adjusted under 35 U.S.C. 154(b) by 79 days.

(21) Appl. No.: 10/421,180

(22) Filed: Apr. 23, 2003

Related U.S. Application Data

(60) Provisional application No. 60/375,596, filed on Apr. 25, 2002.

(51) Int. Cl.[7] ............................................. G11B 5/48
(52) U.S. Cl. ............................ 360/234.8; 360/245.8
(58) Field of Search ......................... 360/245.8, 234.5

(56) References Cited

U.S. PATENT DOCUMENTS

| | | | |
|---|---|---|---|
| 5,467,236 A | 11/1995 | Hatanai et al. | |
| 5,757,585 A | * 5/1998 | Aoyagi et al. | ........... 360/234.5 |
| 5,768,062 A | 6/1998 | Anderson et al. | |
| 5,889,636 A | 3/1999 | Arya et al. | |
| 5,896,247 A | * 4/1999 | Pan et al. | ................ 360/234.5 |
| 5,956,209 A | 9/1999 | Shum | |
| 5,969,906 A | 10/1999 | Arya et al. | |

FOREIGN PATENT DOCUMENTS

JP 01043647 A 2/2001

* cited by examiner

Primary Examiner—A. J. Heinz
(74) Attorney, Agent, or Firm—Faegre & Benson LLP

(57) ABSTRACT

A head suspension or head suspension component article configured for solder ball bonding of a head slider to electrical traces on article. The article including electrical traces formed from electrically conductive material with the electrical traces having a bonding region adapted for electrical bonding to a head slider. Also included is a support structure providing support for at least portions of the electrical traces and including a head slider mounting region adapted to receive the head slider. This structure is configured to mechanically and thermally isolate the bonding region of the electrical traces from the head slider mounting region to reduce mechanical and thermal effects of a solder ball bonding process on the article during solder ball bonding of the head slider to the electrical traces. The support structure may be reduced at or around the bonding region, or the conductive material may be increased to dissipate more heat.

26 Claims, 10 Drawing Sheets

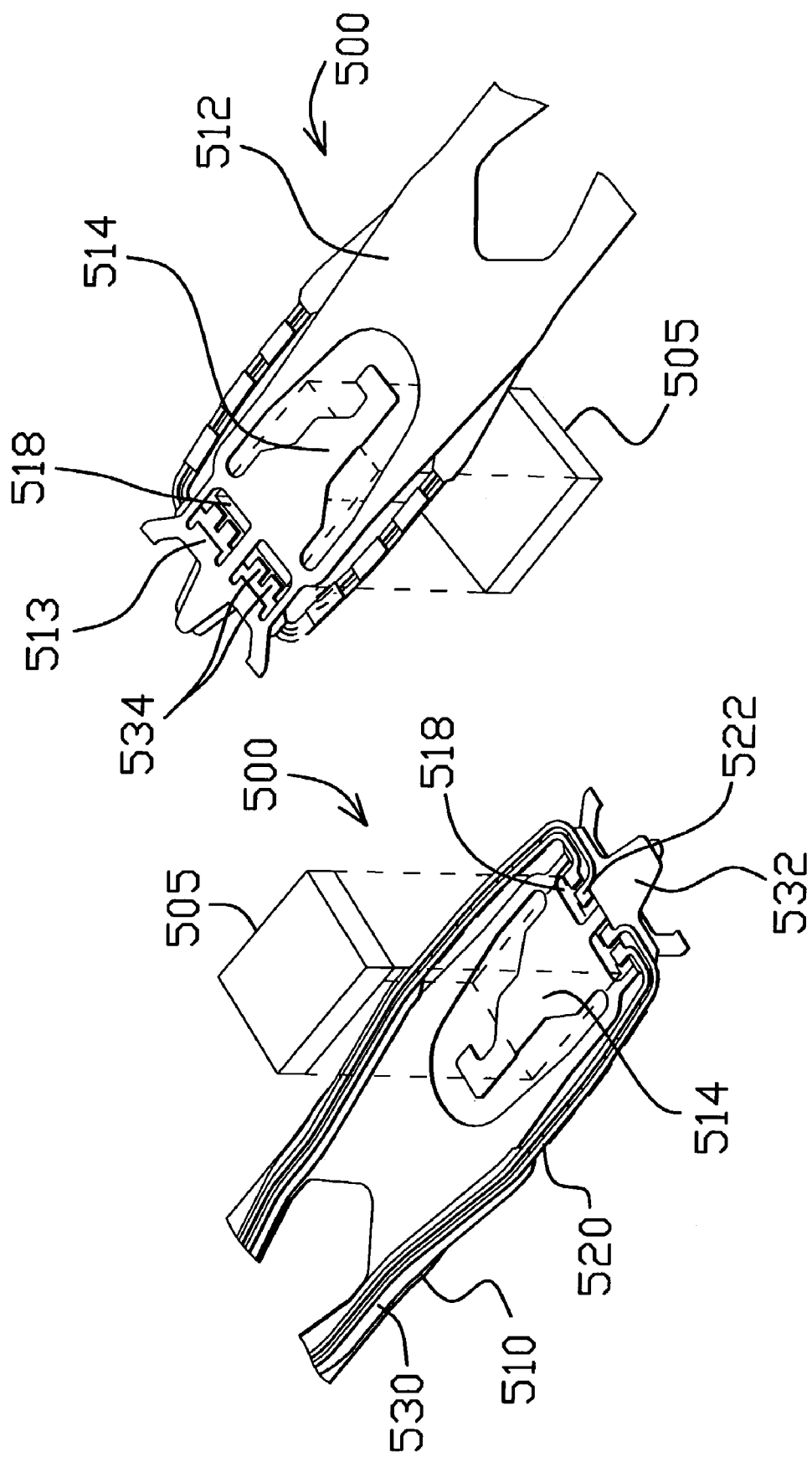

HEAD SUSPENSION CONFIGURED FOR IMPROVED THERMAL PERFORMANCE DURING SOLDER BALL BONDING TO HEAD SLIDER

This application claims the benefit of copending U.S. provisional patent application Ser. No. 60/375,596, filed on Apr. 25, 2002 and entitled HEAD SUSPENSION CONFIGURED FOR SOLDER BALL BONDING TO HEAD SLIDER.

BACKGROUND OF THE INVENTION

Head suspensions are well known and commonly used within dynamic magnetic or optical information storage devices or drives with rigid disks. The head suspension is a component within the disk drive that positions a head slider having a magnetic or optical read/write head over a desired position on the storage media where information is to be retrieved (read) or transferred (written). Head suspensions for use in rigid disk drives typically include a load beam that generates a spring force and that includes a gimbal region or supports a flexure to which a head slider is to be mounted. Head suspensions are normally combined with an actuator arm or E-block to which a mounting region of the load beam is mounted with a base plate so as to position (by linear or rotary movement) the head suspension, and thus the head slider and read/write head, with respect to data tracks of the rigid disk. The rigid disk within a disk drive rapidly spins about an axis, and the head slider is aerodynamically designed to "fly" on an air bearing generated by the spinning disk.

The head suspension typically includes electrical traces that electrically connect the read/write head to control electronics mounted external to the head suspension. The traces may be attached to the components of the head suspension, such as the load beam and/or flexure, or they may be integrally formed with the components. The traces typically terminate in slider bond pads at a distal end of the head suspension in the head slider mounting region. The read/write head is then electrically connected to the traces through bonding of the head slider to the slider bond pads. This bonding may be accomplished through various methods, but most typically through gold ball bonding or solder ball bonding.

Gold ball bonding is accomplished by contacting a tool to the head suspension to support the back side of the bonding pads during ultrasonic placement of the gold ball between the head slider and trace bonding pads. Gold ball bonding requires and produces very little heat and results in little or no shrinkage of the gold ball after the bonding procedure. However, contact of the tool to the head suspension may cause distortion in or damage to the head suspension components. In addition, in some head suspension configurations an opening in the head suspension components, such as the load beam, near the bonding region is required so that the tool can contact the necessary parts of the head suspension. As a result, the load beam must be wider, which causes the head suspension to have lower resonant frequencies than are desired for optimum performance of the head suspension.

Solder ball bonding is accomplished by applying heat at or near a solder ball positioned at the head slider and trace bonding pads. The heat melts the solder ball. The solder wets to the head slider and trace bonding pads, and then shrinks upon cooling. Solder ball bonding does not require contact with the head suspension, which reduces the likelihood of damage to or distortion of the head suspension due to contact by a tool. Without the tool, the need for an opening in some load beam configurations is eliminated, and thus the load beam may be narrower and thus may have better resonant performance. In addition, bonding attachments by solder ball bonding are easier to rework, when necessary, than gold ball bonding attachments. However, shrinkage of the solder ball may cause distortion in the head suspension components at or near the bonding region, which may then affect head suspension characteristics, such as static attitude. The ability to use solder ball bonding, but without the resulting distortion, would be the preferable head slider bonding situation.

SUMMARY OF THE INVENTION

The present invention provides a head suspension or head suspension component configured for solder ball bonding of a head slider to electrical traces on the head suspension or head suspension component. The head suspension or head suspension component includes electrical traces formed from electrically conductive material with the electrical traces having a bonding region adapted for electrical bonding to a head slider. Also included is a support structure providing support for at least portions of the electrical traces and having a head slider mounting region adapted to receive the head slider. The support structure is configured to mechanically and thermally isolate the bonding region of the electrical traces from the head slider mounting region to reduce the mechanical and thermal effects of a solder ball bonding process on the head suspension or head suspension component during solder ball bonding of the head slider to the electrical traces.

In one embodiment, the support structure is reduced in an area beneath the bonding region so as to mechanically and thermally isolate the bonding region. In another embodiment, the electrical traces include strain relief portions formed generally adjacent the bonding region and generally free from connection to the support structure. In a further embodiment, the bonding region of the electrical traces includes bonding pads and an area of conductive material of the bonding pads is increased relative to conventional bonding pads so as to dissipate more heat from the bonding process. These embodiments may be provided alone or in combinations to achieve the desired level of isolation.

In yet another embodiment, the support structure includes a U-shaped slit formed around the bonding region so that the electrical traces of the bonding region are positioned on at least one support structure tongue. The support structure material of the tongue may be reduced to provide more of a cantilevered bonding region. In addition, the conductive material of the bonding region may be increased relative to conventional bonding regions so as to dissipate more heat during the bonding process.

BRIEF DESCRIPTION OF THE SEVERAL VIEWS OF THE DRAWINGS

FIG. 11 is a top view of a second variation of the head suspension of FIG. 8.

FIG. 12 is a bottom view of the head suspension of FIG. 11.

DETAILED DESCRIPTION OF THE INVENTION

The present invention provides various configurations of head suspensions and head suspension components, such as flexures, which resist distortion in the slider bonding region due to solder ball bonding affects. Therefore, these novel configurations lend themselves to bonding by solder ball bonding and thus the benefits of this bonding method may be realized for these head suspension configurations.

Figure 1:
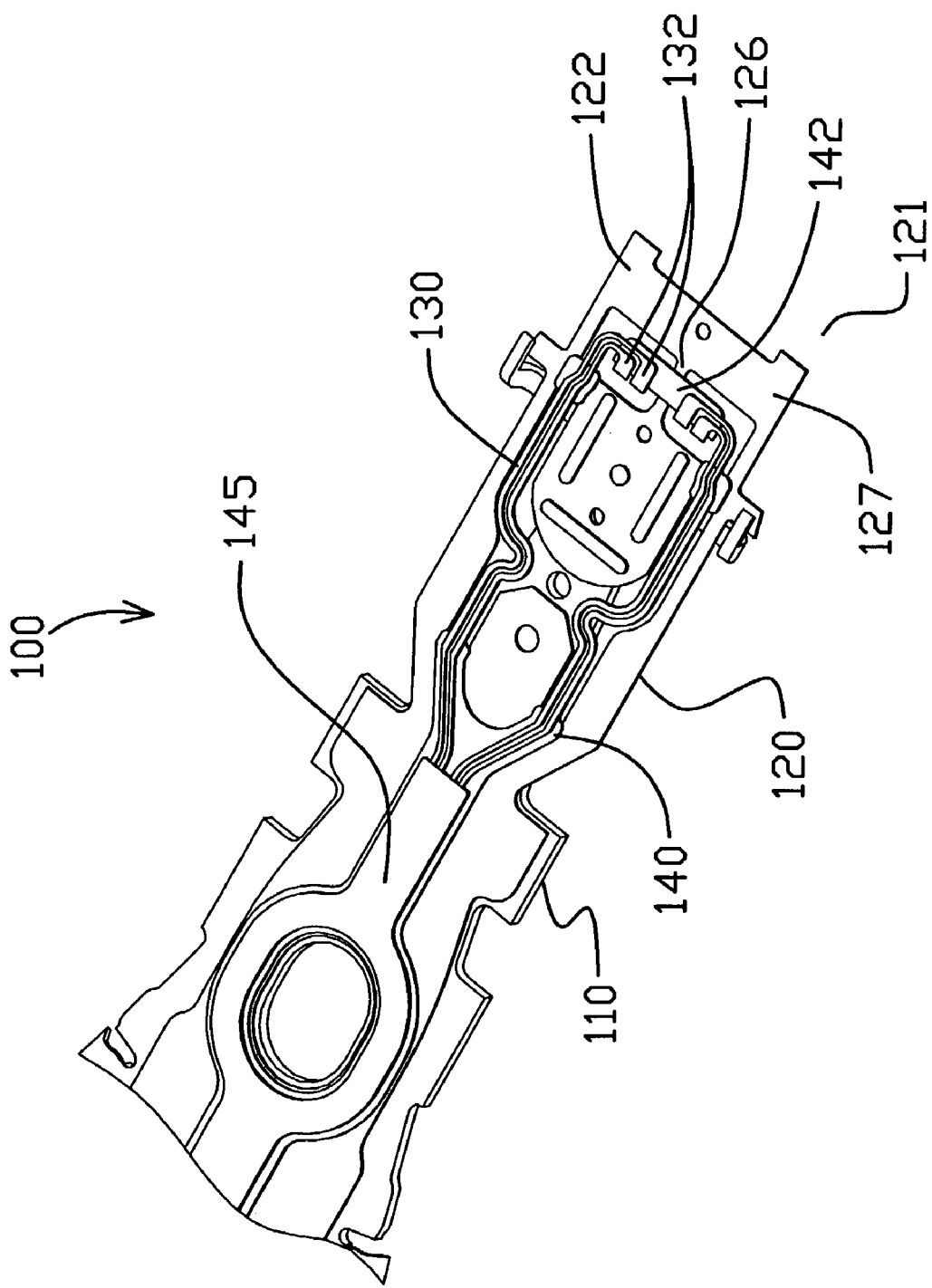
FIG. 1 is a top view of one embodiment of a head suspension in accordance with the present invention, including a flexure having structure for use with solder ball bonding.
Figure 2:
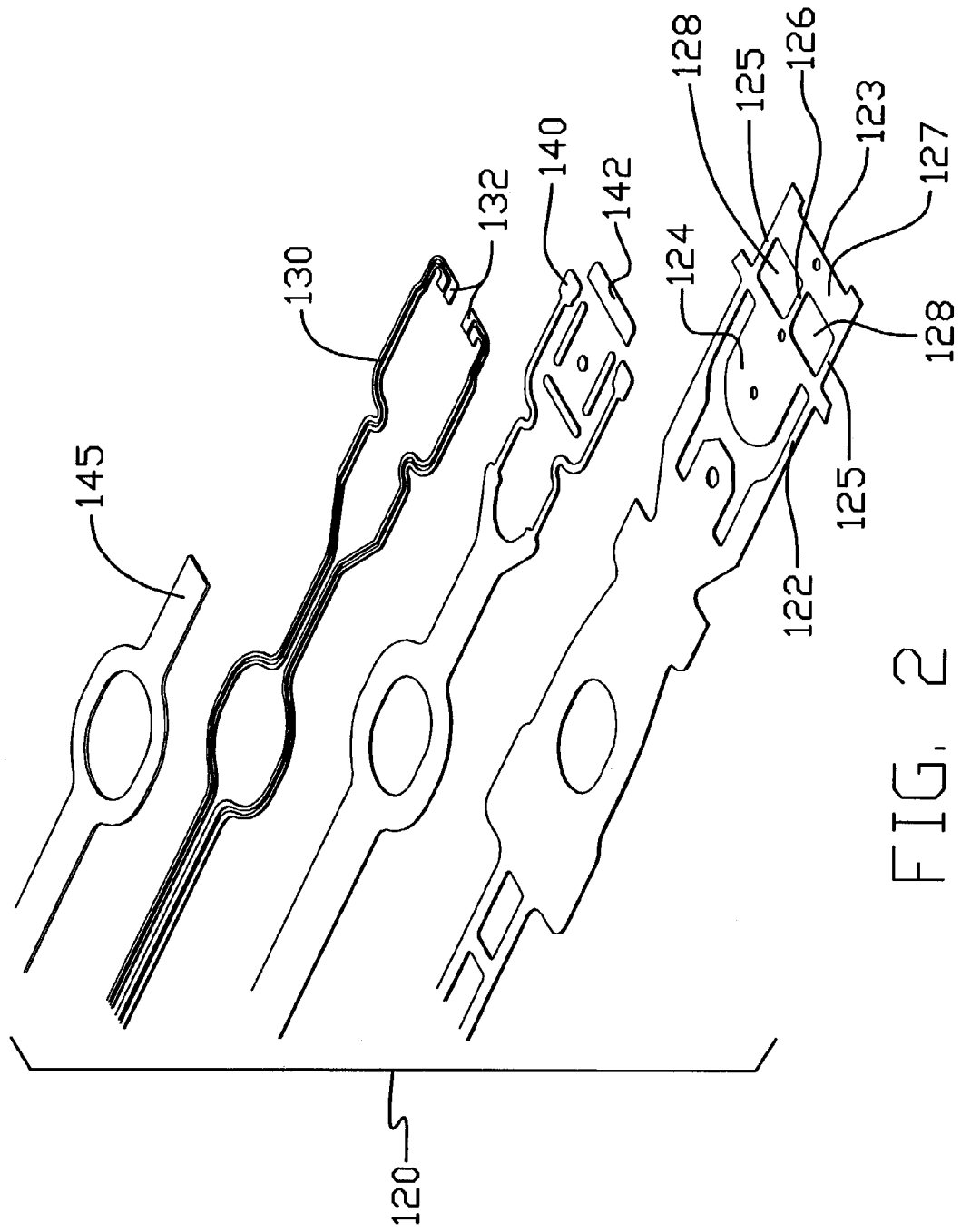
FIG. 2 is an exploded view of the flexure of FIG. 1.
Figure 3:
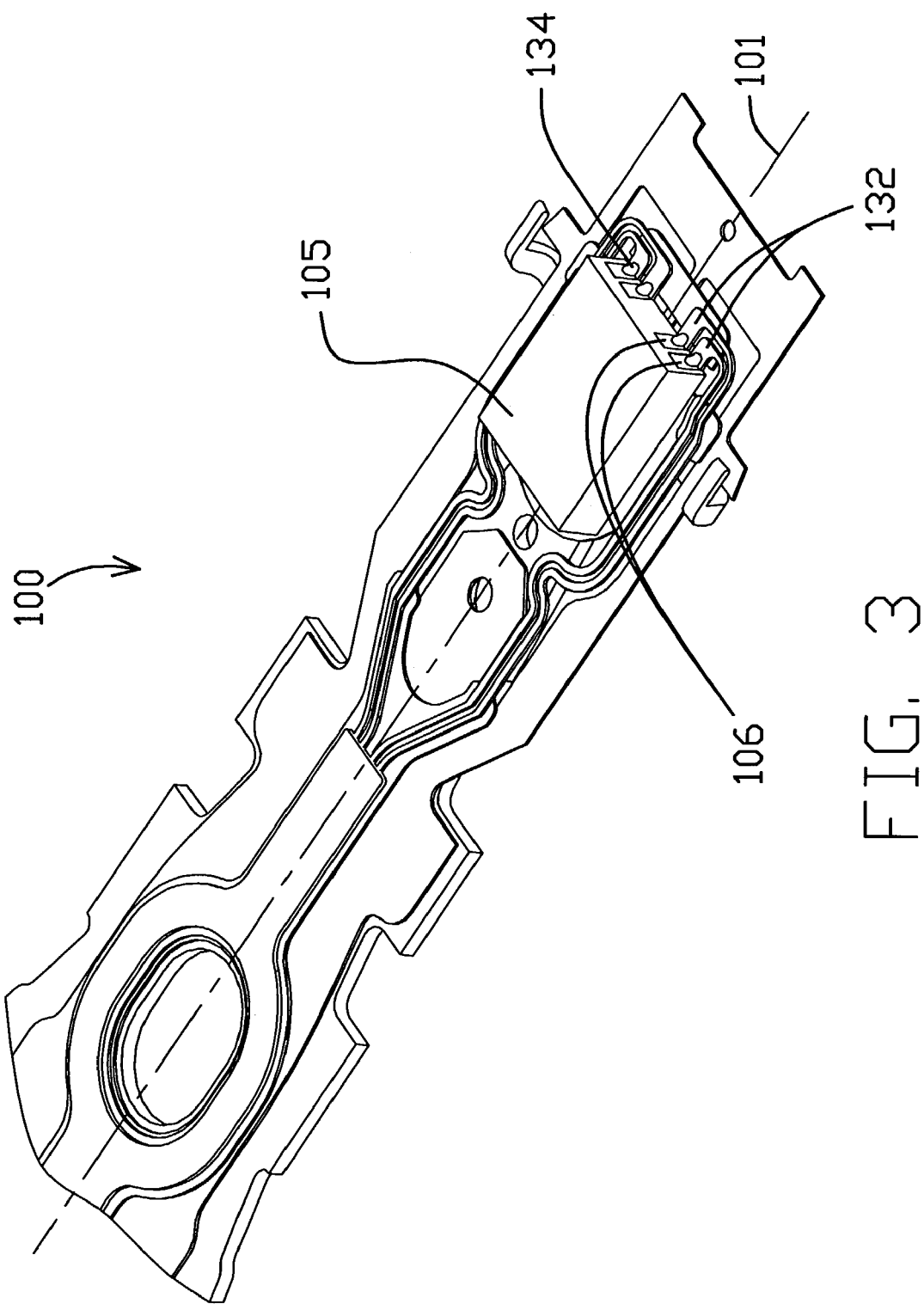
FIG. 3 is a top view of the head suspension of FIG. 1 further including a head slider mounted to the flexure and electrically connected via solder ball bonding.

Referring to FIGS. 1–3, a portion of a first embodiment of a head suspension 100 in accordance with the present invention is shown including a load beam 110 and a flexure 120. The flexure 120 includes integrated electrical leads or traces 130 that are preferably formed of copper and/or other electrically conductive material, a dielectric layer 140 and a stainless steel 122 or other resilient material layer. The dielectric layer 140 and stainless steel 122 together providing a support structure for the traces 130 and head slider 105. In addition, a cover layer 145 over the copper traces 130 may also be provided, if desired. The flexure 120 includes at a distal end 121 a head slider mounting region 124 to which a head slider 105 (shown in FIG. 3) is mounted. The head slider 105 includes head slider bonding pads 106 at one end that align with trace bonding pads 132 provided in the traces 130 on the flexure 120. Solder balls 134 are then applied at the juncture of the two types of bonding pads so as to electrically connect the head slider 105 to the traces 130.

The flexure 120 includes at the distal end 121 a distal portion 123 including a cross beam 127 that is transverse to the longitudinal axis 101 of the head suspension 100 and flexure 120. The cross beam 127 connects to the head slider mounting region 124 at a center longitudinal member 126 and two side longitudinal members 125, such that two apertures 128 are formed between the head slider mounting region 124 and the cross beam 127. A cross member 142 is also formed in the dielectric layer 140, which is positioned over the two apertures 128 and the center member 126. The dielectric cross member 142 supports the trace bonding pads 132 over the apertures 128 to facilitate connection to the head slider 105. The cross beam 127 provides additional stability to the flexure 120 at the distal end 121 so that the distal end 121 of the flexure 120 is not easily damaged during fabrication or handling.

In this embodiment, the area of the stainless steel layer 122 around the trace bonding pads 132 is reduced, such that support of the trace bonding pads 132 is provided by the dielectric cross member 142. As a result, the stainless steel layer 122 is relatively isolated from the trace bonding pads 132 and, thus, the heat and potential distortion of the bonded solder balls 134. This embodiment also provides for trace bonding pads 132 that are generally larger than standard bonding pads. Therefore, the area of copper forming the trace bonding pads 132 is increased and provides for increased heat dissipation during bonding of the solder balls 134. However, the copper pad area cannot be increased to too large of a size, or else uneven solder wicking will occur, resulting in poor solder bonds. Although shown together in the same embodiment, it is to be understood that reduction of the stainless steel layer 122 and increase in the area of the copper trace bonding pads 132 each may be provided alone, as well as in combination, for improving performance of the head suspension 100 with solder ball bonding.

Figure 4:
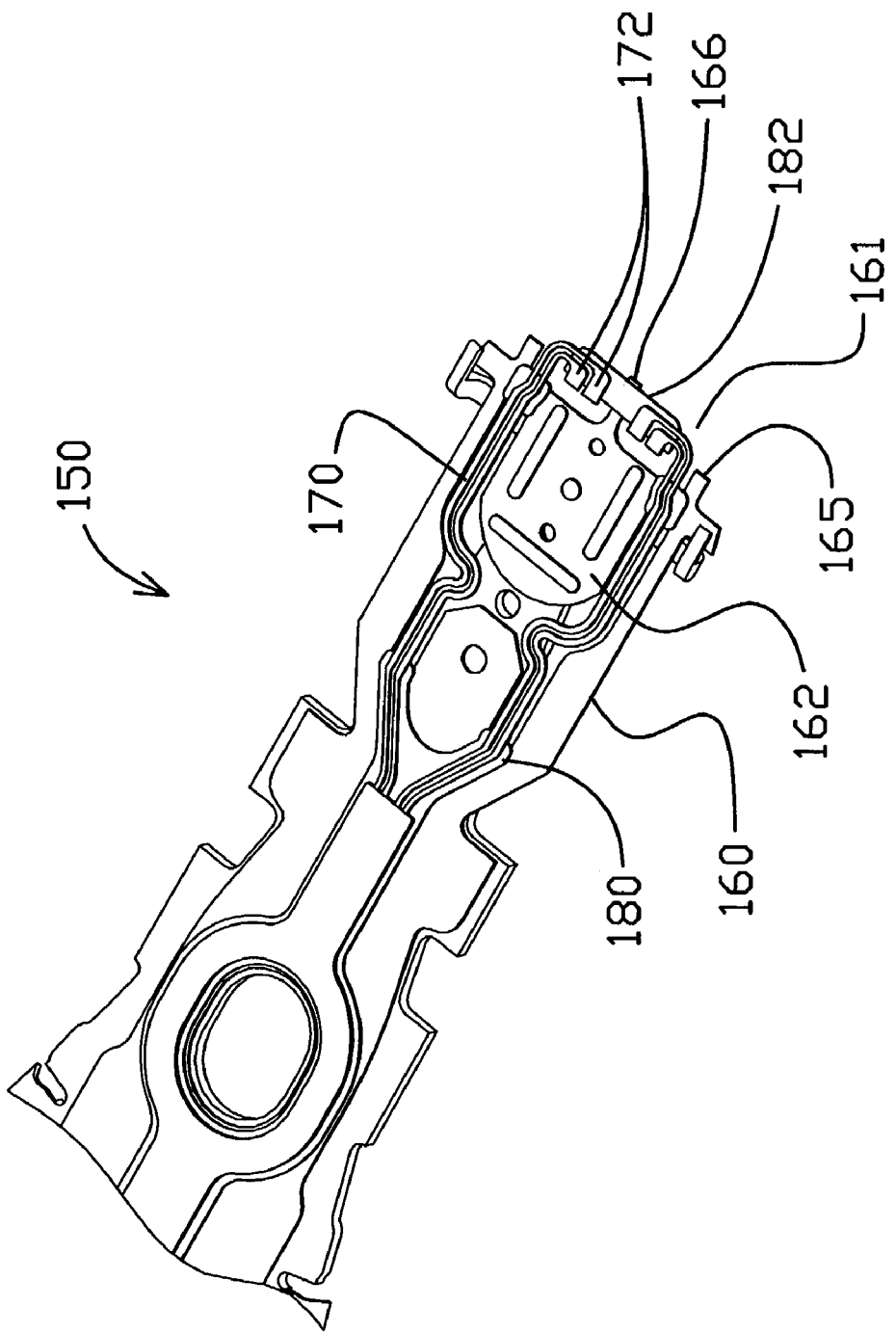
FIG. 4 is a top view of a first variation of the head suspension of FIG. 1.

In FIG. 4, a first variation of the above-described head suspension 100 is shown as head suspension 150 having a flexure 160, including a head slider mounting region 162, traces 170 and a dielectric layer 180. In this alternative embodiment, a stainless steel layer 165 of the flexure 160 includes a center support 166 upon which a dielectric cross member 182 is positioned for supporting trace bonding pads 172. These trace bonding pads 172 preferably include increased surface area, but may be standard size, as desired. The dielectric cross member 182 provides adequate support for the trace bonding pads 172 that extend from a distal end 161 of the flexure 160. As shown, the stainless steel layer 165 is effectively isolated from the heat and distortion caused by solder ball bonding of a head slider (not shown) to the trace bonding pads 172.

Figure 5:
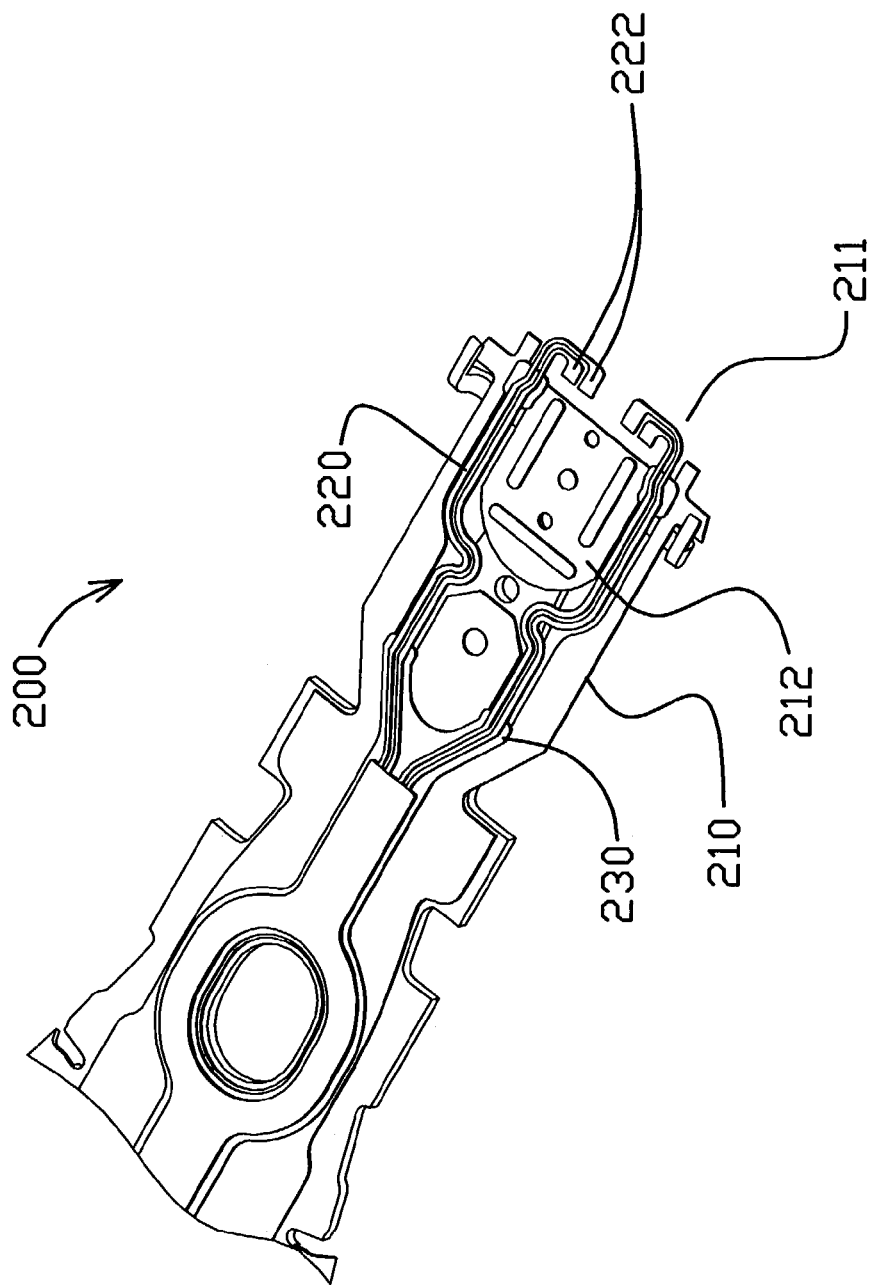
FIG. 5 is a top view of a second variation of the head suspension of FIG. 1.

Referring now to FIG. 5, a second variation of the above-described head suspension 100 in accordance with the present invention is shown as head suspension 200 having a flexure 210, including a head slider mounting region 212, traces 220 and a dielectric layer 230. In this embodiment, trace bonding pads 222 extend beyond a distal end 211 of the flexure 210 without direct support by either dielectric or stainless steel portions, such as shown in the previous two embodiments. This cantilevered configuration of the traces 220 provides increased isolation from the heat and distortion of solder ball bonding at the trace bonding pads 222. As with the previous embodiments, the trace bonding pads 222 preferably have increased surface area, although it is not required.

Figure 6:
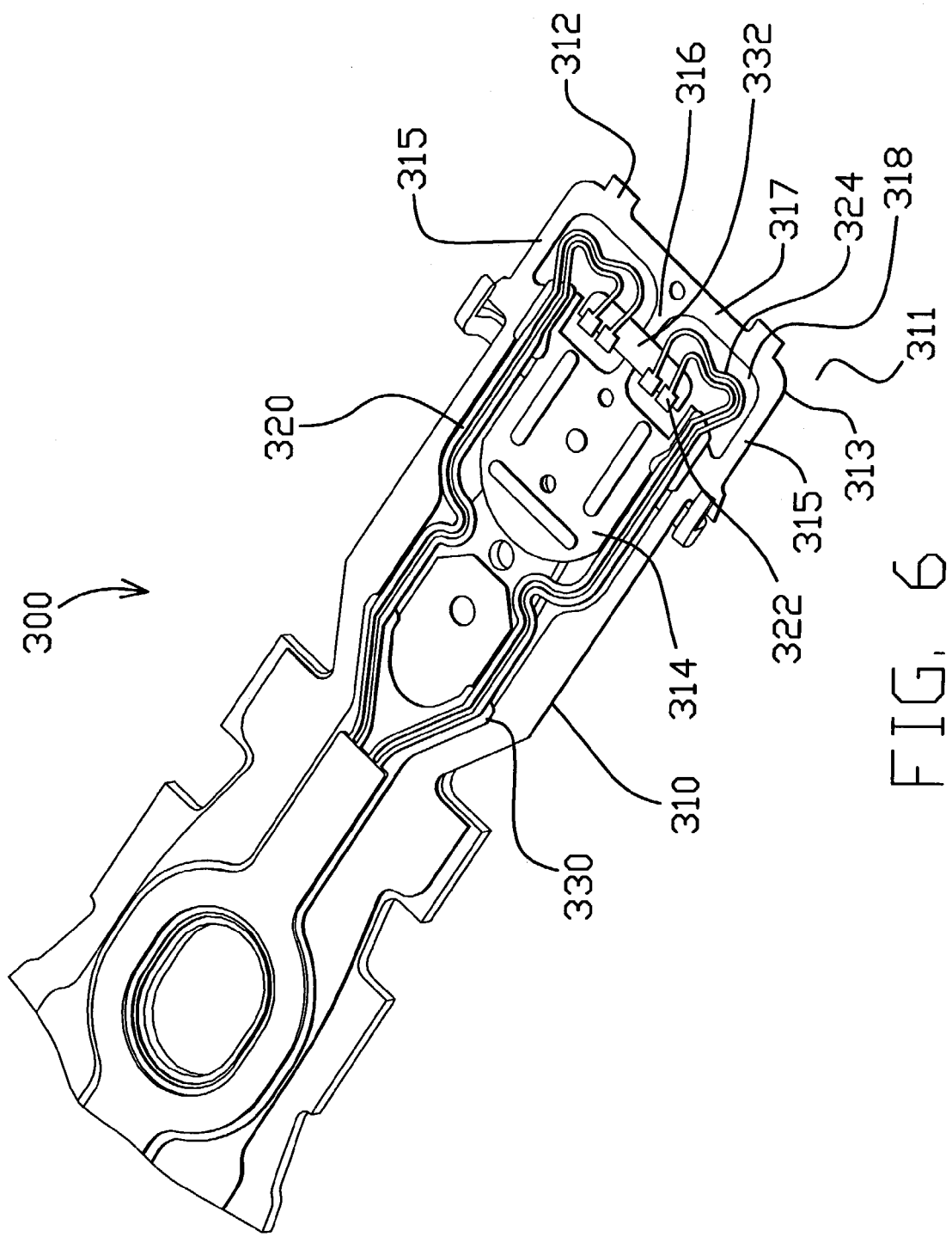
FIG. 6 is a top view of a second embodiment of a head suspension in accordance with the present invention.

Referring now to FIG. 6, a second embodiment of a head suspension 300 in accordance with the present invention is shown having a flexure 310, including a head slider mounting region 314 and traces 320. A support structure includes a dielectric layer 330 and a stainless steel layer 312 configured in a similar manner to the stainless steel layer 122 of flexure 120, having a head slider mounting region 314 and a distal portion 313 including a cross beam 317 at a distal end 311. The cross beam 317 connects to the head slider mounting region 314 at a center longitudinal member 316 and two side longitudinal members 315, such that two apertures 318 are formed between the head slider mounting region 314 and the cross beam 317. A dielectric member 332 that extends across center longitudinal member 316 over apertures 318 provides support for trace bonding pads 322. In this embodiment, however, the traces 320 are configured to include strain relief portions 324 positioned over apertures 318, adjacent the trace bonding pads 322. The strain relief portions 324 are generally serpentine in shape. They provide additional compliance to the traces 320 and aid in reducing distortion of the flexure 310 due to solder ball bonding at the trace bonding pads 322.

Figure 7:
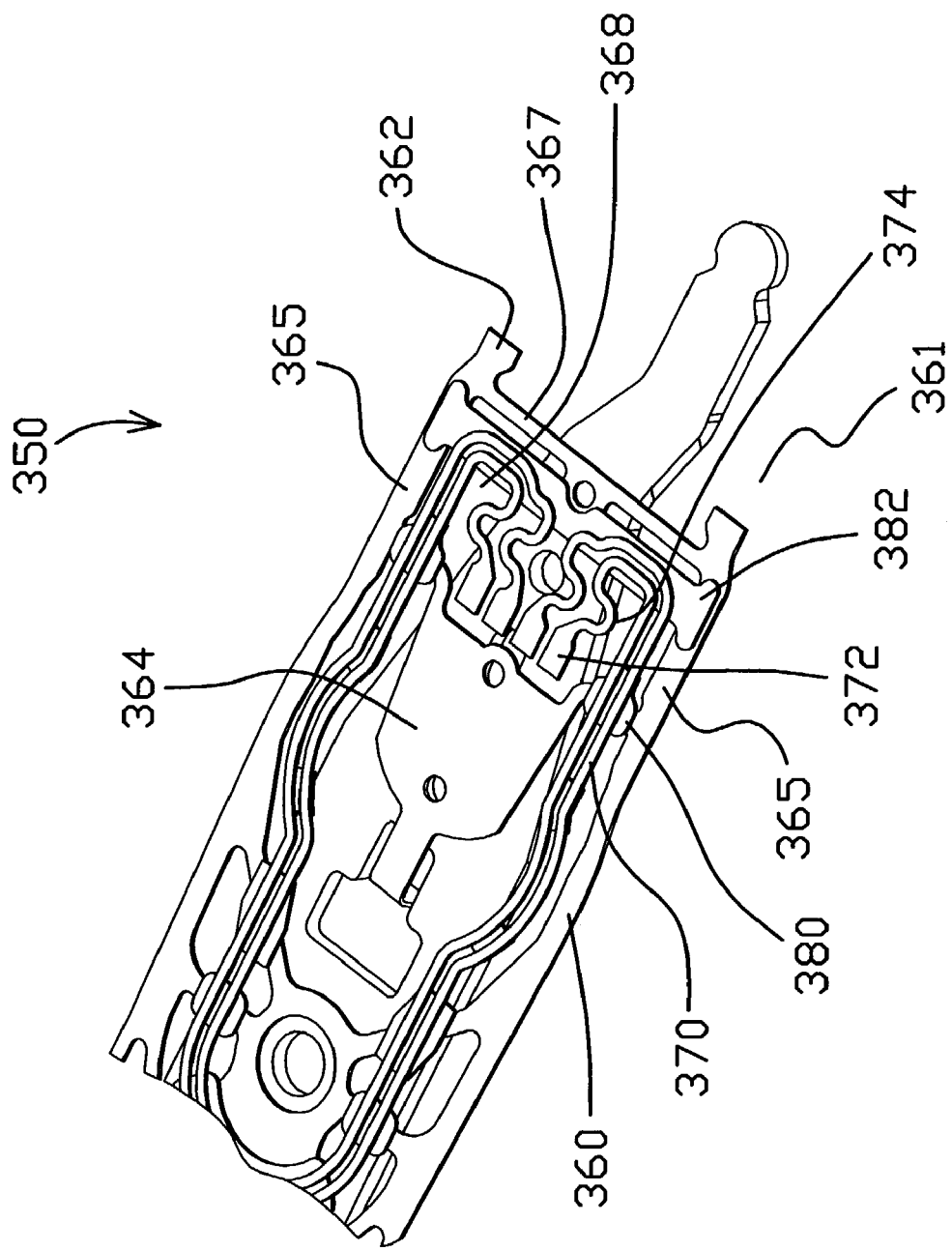
FIG. 7 is a top view of an alternative embodiment of the head suspension of FIG. 6.

In FIG. 7, a first variation of the embodiment described above with reference to FIG. 6 is shown as head suspension 350 having a flexure 360, including traces 370 and a dielectric layer 380. A stainless steel layer 362 of the flexure 360 includes a head slider mounting region 364 and a cross member 367 at a distal end 361. Two side members 365 join the cross member 367 forming a single aperture 368 between the cross member 367 and the head slider mounting region 364. A dielectric member 382 is configured to span the aperture 368 supported on the side members 365. The traces 370 are supported by the dielectric member 382. In this embodiment, the traces 370 also include strain relief portions 374 positioned over the aperture 368, adjacent the trace bonding pads 372. The strain relief portions 374 are generally serpentine in shape and provide additional compliance for reduction of distortion due to solder ball bonding. The trace bonding pads 372 and strain relief portions 374 are supported in cantilever form over the aperture 368 without engagement with the dielectric layer 380 or stainless steel layer 362, such that increased mechanical and thermal isolation are provided.

Figure 8:
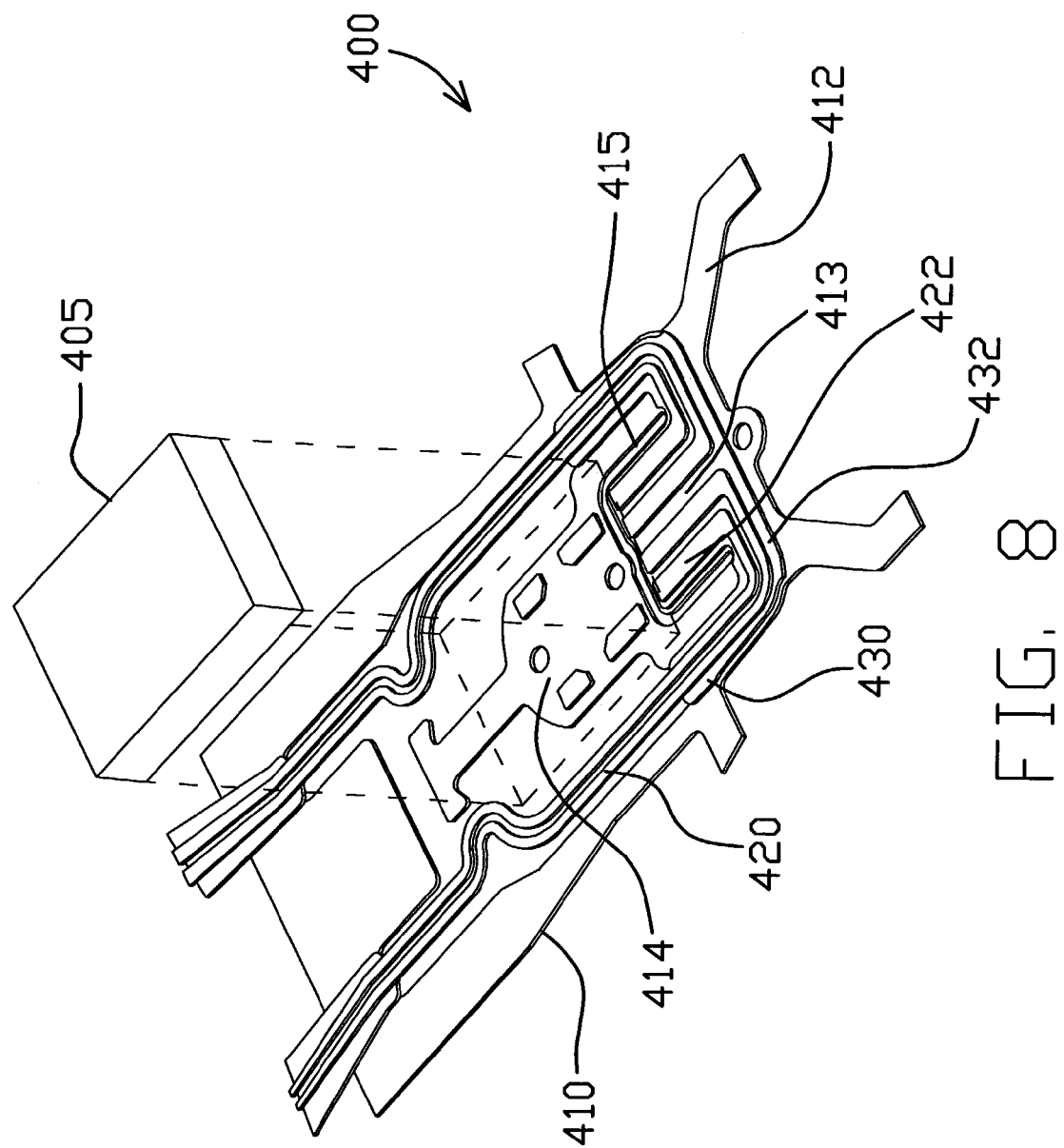
FIG. 8 is a top view of a third embodiment of a head suspension in accordance with the present invention.

Referring now to FIG. 8, a third embodiment of a head suspension 400 in accordance with the present invention is shown having a flexure 410 including traces 420. The flexure 410 includes a head slider mounting region 414 to which a head slider 405 is attached. Traces 420 includes trace bonding pads 422 positioned adjacent the head slider 405. In this embodiment, a support structure includes a dielectric layers 430 and a stainless steel layer 412 configured to include a tab 413 upon which the trace bonding pads 422 are located over a dielectric portion 432. The tongue 413 is created by a U-shaped slit 415 formed in the stainless steel layer 412 between the head slider mounting region 414 and the trace bonding pads 422. Provision of the slit 415 and tab 413 results in improved mechanical and thermal isolation of the trace bonding pads 422 from the head slider mounting region 414 and other areas of the flexure 410. Therefore, distortion due to mechanical and/or thermal effects of solder ball bonding is reduced.

Figures 9, 10:
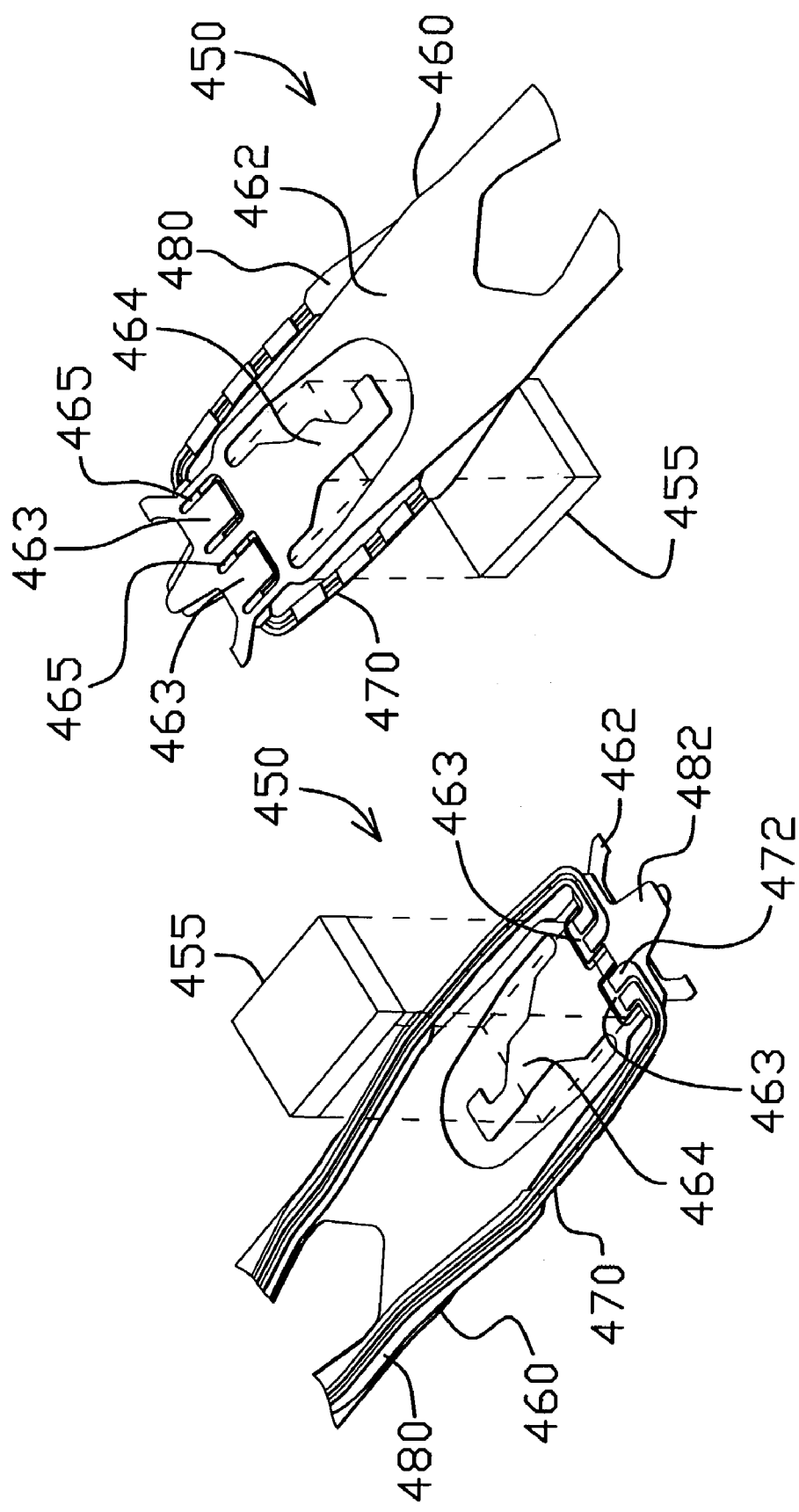
FIG. 9 is a top view of a first variation of the head suspension of FIG. 8.
FIG. 10 is a bottom view of the head suspension of FIG. 9.

In FIGS. 9 and 10, a first variation of the embodiment described above with reference to FIG. 8 is shown as head suspension 450, having a flexure 460, including traces 470 and a dielectric layer 480. The flexure 460 includes a head slider mounting region 464 to which a head slider 455 is attached. In this embodiment, a stainless steel layer 462 includes two tabs 463 (best shown in FIG. 10) supporting trace bonding pads 472 over a dielectric portion 482. The tabs 463 are each formed by a U-shaped slit 465 in the stainless steel layer 462.

In FIGS. 11 and 12, a second variation of the embodiment described above with reference to FIG. 8 is shown as head suspension 500 having a flexure 510, including traces 520 and a dielectric layer 530. The flexure 510 includes a stainless steel layer 512 and a head slider mounting region 514 to which a head slider 505 is attached. The stainless steel layer 512 includes two apertures 518, similar to those in the embodiment shown in FIGS. 6 and 7. However, in this embodiment, the apertures 518 are formed to include tabs 513 projecting partially into the apertures 518. Trace bonding pads 522 are positioned over the apertures 518 and a dielectric portion 532, including dielectric tabs 534. The partial tabs 513 provide additional support to the dielectric portion 532 when supporting the trace bonding pads 522 over the dielectric tabs 534.

Solder ball bonding is a preferred method of electrically connecting a head slider to electrical traces on a head suspension. In order to reduce the mechanical and thermal effects of the bonding process on the flexure of the head suspension, the present invention provides various configurations for mechanically and thermally isolating the trace bonding pads from the head slider mounting region, while positioning the trace bonding pads adjacent to the location of the slider bonding region to facilitate bonding between the pads and the slider. In one aspect of the present invention, the trace bonding pads of a head suspension flexure are mechanically and thermally isolated from a slider bonding region of the flexure so as to facilitate bonding of a slider to the pads by solder ball bonding methods. In yet another aspect of the present invention, mechanical and thermal isolation of the trace bonding pads is achieved by elimination of the stainless steel material beneath the trace bonding pads so as to effectively cantilever the pads. As a result, the trace bonding pads and associated traces are free to distort as needed due to the bonding process, but with a reduction in distortion of the remainder of the flexure in the head slider mounting area.

In another aspect of the present invention, the area of conductive material at the trace bonding pads is increased over the area of conventional bonding pads to aid in dissipating more heat from the bonding process and, thus, reducing related distortion in the flexure components. In yet another aspect of the present invention, the traces are formed with strain relief portions that are free from connection to the stainless steel layer and generally adjacent to the trace bonding pads. These strain relief portions provide further compliance to the cantilevered traces and bonding pads so as to accommodate distortion resulting from the bonding process. Reconfiguration of the traces and trace bonding pads may be used alone or in combination with each and/or with reduction of the stainless steel layer, as described above.

In one other aspect of the invention, a U-shaped slit is provided in the stainless steel layer around the trace bonding pads, resulting in the pads being positioned on one or more tongues. These tongues are thus mechanically and thermally isolated from the head slider mounting region, thereby reducing distortion from the bonding process, but still providing support for the pads. In one variation of this configuration, the stainless steel tongue is combined with reduced stainless steel, resulting in cantilevered trace bonding pads with additional support. In another variation, the trace bonding pads include increased surface area to provide increased heat dissipation in combination with the mechanical and thermal isolation of the tongue structure.

Although the present invention has been described with reference to preferred embodiments, workers skilled in the art will recognize that changes may be made in form and detail without departing from the spirit and scope of the invention. In addition, the invention is not to be taken as limited to all of the details thereof as modifications and variations thereof may be made without departing from the spirit or scope of the invention.

What is claimed is:

1. A head suspension or head suspension component configured for solder ball bonding of a head slider to electrical traces on the head suspension or head suspension component, the head suspension or head suspension component comprising:

electrical traces formed from electrically conductive material, the electrical traces including a bonding region being generally planar with other portions of the electrical traces and adapted for solder ball bonding to a head slider; and a support structure including a generally planar layer of spring metal providing support for at least portions of the electrical traces, the planar layer of suspension material including a head slider mounting region adapted to receive the head slider, with the spring metal configured not to extend in an area beneath the bonding region to reduce mechanical and thermal effects on the head suspension or head suspension component during solder ball bonding of the head slider to the electrical traces.

2. The head suspension or head suspension component of claim 1, wherein the electrical traces comprise strain relief portions formed generally adjacent the bonding region and generally free from connection to the support structure.

3. The head suspension or head suspension component of claim 1, wherein the electrical traces further comprise strain relief portions formed generally adjacent the bonding region and generally free from connection to the support structure.

4. The head suspension or head suspension component of claim 1, wherein the support structure comprises an aperture formed around at least a portion of the bonding region so that the electrical traces of the bonding region are positioned on at least one support structure tongue.

5. The head suspension or head suspension component of claim 4, wherein the support structure is configured not to extend beneath at least a portion of the support structure tongue.

6. The head suspension or bead suspension component of claim 5, wherein the bonding region is partially cantilevered but is still supported.

7. The head suspension or head suspension component of claim 1, wherein the planar layer of spring metal is comprised of stainless steel.

8. The head suspension or head suspension component of claim 1, where in the support structure further comprises a dielectric layer between the electrical traces and the planar layer of spring metal, the dielectric layer configured to support portions of the electrical traces.

9. The head suspension or head suspension component of claim 8, wherein the dielectric layer provides support for the bonding region when the is configured not to extend beneath the bonding region.

10. The head suspension or head suspension component of claim 9, wherein both the dielectric layer and the planar layer of spring metal are configured not to extend beneath the bonding region leaving the bonding region free from support.

11. The head suspension or head suspension component of claim 1, wherein the head suspension component comprises a flexure.

12. A flexure comprising:
a slider bonding region on a stainless steel layer that is in a plane with other portions of the flexure adapted to receive a head slider;
electrical traces including bonding pads located adjacent to the slider bonding region that are generally planar to other portions of the traces; and
a support structure for supporting the bonding pads to reduce mechanical and thermal effects of a solder ball bonding process on the flexure during solder ball bonding of a head slider to the electrical traces.

13. The flexure of claim 12, wherein the support structure includes a dielectric layer supported over an aperture in the stainless steel layer.

14. The flexure of claim 12, wherein the support structure includes apertures in the stainless steel layer with portions of the electrical traces and the bonding pads cantilevered over the apertures.

15. The flexure of claim 12, wherein the electrical traces further include strain relief portions formed generally adjacent the bonding pads.

16. The flexure of claim 15, wherein support structure includes apertures in the stainless steel layer with the strain relief portions positioned over the apertures.

17. The flexure of claim 12, wherein the support structure includes U-shaped slits formed around the bonding pads resulting in support structure tongues upon which the bonding pads are located.

18. The flexure of claim 17, wherein the support structure tongues comprise a dielectric layer formed between the electrical traces and the stainless steel layer and wherein the stainless steel layer of the tongues is reduced such that the bonding pads are supported by the dielectric layer over apertures in the stainless steel layer.

19. A wireless head suspension assembly including:
a generally planar spring metal layer including a slider mounting region having an edge;
a head slider having bond pads mounted to the slider mounting region with the bond pads beyond the edge of the slider mounting region and non-planar with the spring metal layer;
conductive traces having spring metal layer-free ends of sufficient length to provide mechanical and thermal solder ball bonding isolation extending from the spring metal layer and terminating at planar bond pads in a plane generally parallel to the spring metal layer and adjacent to the head slider bond pads; and
solder ball bonds between the conductive trace bond pads and the head slider bond pads.

20. The head suspension assembly of claim 19 and further including an insulating layer support extending from the spring metal layer for supporting at least portions of the spring metal layer-free ends of the conductive traces.

21. The head suspension assembly of claim 20 wherein the spring metal layer includes a member extending from the slider mounting region for supporting the insulating layer support.

22. The head suspension assembly of claim 20 wherein at least portions of the conductive trace bond pads are located on the insulating layer support.

23. The head suspension assembly of claim 19 wherein:
the edge of the slider mounting region is adjacent to one or more apertures in the spring metal layer; and
the spring metal layer-free ends of the conductive traces extend into the one or more apertures.

24. The head suspension assembly of claim 19 wherein:
the edge of the slider mounting region is a distal edge of the spring metal layer; and
the spring metal layer-free ends of the conductive traces extend beyond the distal end of spring metal layer.

25. The head suspension assembly of claim 19 wherein at least portions of the spring metal layer-free ends of the conductive traces have a serpentine shape.

26. A wireless head suspension assembly, including:
a generally planar spring metal layer including:
a slider mounting region having an edge;
lead mounting tabs adjacent to the edge of the mounting region; and
gaps separating the tabs from the edges of the slider mounting region for providing mechanical and thermal solder ball bonding isolation;
a head slider having bond pads mounted to the slider mounting region with the bond pads over the gaps and non-planar with the spring metal layer;
conductive traces having ends extending over the tabs and terminating at planar bond pads in a plane generally parallel to the spring metal layer and adjacent to the head slider bond pads; and
solder ball bonds between the conductive trace bond pads and the head slider bond pads.

* * * * *

UNITED STATES PATENT AND TRADEMARK OFFICE
CERTIFICATE OF CORRECTION

PATENT NO.     : 6,965,499 B1
DATED          : November 15, 2005
INVENTOR(S)    : Yiduo Zhang et al.

It is certified that error appears in the above-identified patent and that said Letters Patent is hereby corrected as shown below:

Column 7,
Line 18, delete "bead" and insert -- head --.
Line 25, delete "where in" and insert -- wherein --.

Signed and Sealed this

Twenty-fourth Day of January, 2006

JON W. DUDAS
*Director of the United States Patent and Trademark Office*